United States Patent
Pang et al.

(10) Patent No.: US 10,317,790 B2
(45) Date of Patent: Jun. 11, 2019

(54) SUB-RESOLUTION ASSIST FEATURES IN SEMICONDUCTOR PATTERN WRITING

(71) Applicant: D2S, Inc., San Jose, CA (US)

(72) Inventors: Leo Pang, Saratoga, CA (US); Akira Fujimura, Saratoga, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 15/701,366

(22) Filed: Sep. 11, 2017

(65) Prior Publication Data

US 2018/0074393 A1    Mar. 15, 2018

Related U.S. Application Data

(60) Provisional application No. 62/393,509, filed on Sep. 12, 2016.

(51) Int. Cl.
| | |
|---|---|
| *G06F 17/50* | (2006.01) |
| *G03F 1/00* | (2012.01) |
| *G03F 7/20* | (2006.01) |
| *G03F 1/36* | (2012.01) |

(52) U.S. Cl.
CPC ............... *G03F 1/144* (2013.01); *G03F 1/36* (2013.01); *G03F 7/70025* (2013.01); *G03F 7/70441* (2013.01)

(58) Field of Classification Search
CPC .......... G06F 17/5081; G03F 1/26; G03F 1/36; G03F 1/44; G03F 1/72; G03F 1/76; G03F 7/70441; G03F 7/70443
USPC ...................................................... 716/52–53
See application file for complete search history.

(56) References Cited

U.S. PATENT DOCUMENTS

| | | | |
|---|---|---|---|
| 2003/0126581 A1* | 7/2003 | Pang ................. | G03F 1/26 716/52 |
| 2009/0037861 A1* | 2/2009 | Chen ................. | G06F 17/5081 716/104 |
| 2015/0040081 A1* | 2/2015 | Huang ............... | G03F 1/36 716/53 |

* cited by examiner

Primary Examiner — Paul Dinh
(74) Attorney, Agent, or Firm — MLO, A Professional Corp.

(57) ABSTRACT

A method for optical proximity correction includes inputting a physical design having a plurality of shapes. Each shape has a plurality of corners, and the physical design is to be exposed on a surface of a substrate. A set of sub-resolution assist features (SRAFs) for the physical design is determined, where a plurality of SRAFs in the set of SRAFs interact. The plurality of SRAFs together provide better dimensional control of one corner of one shape in the plurality of shapes, when exposed on the substrate, compared to using a single SRAF to control a dimension of the one corner. The plurality of SRAFs includes a positive SRAF and a negative SRAF. A modified physical design is output, where the modified physical design comprises the physical design, as modified by the set of SRAFs.

13 Claims, 18 Drawing Sheets

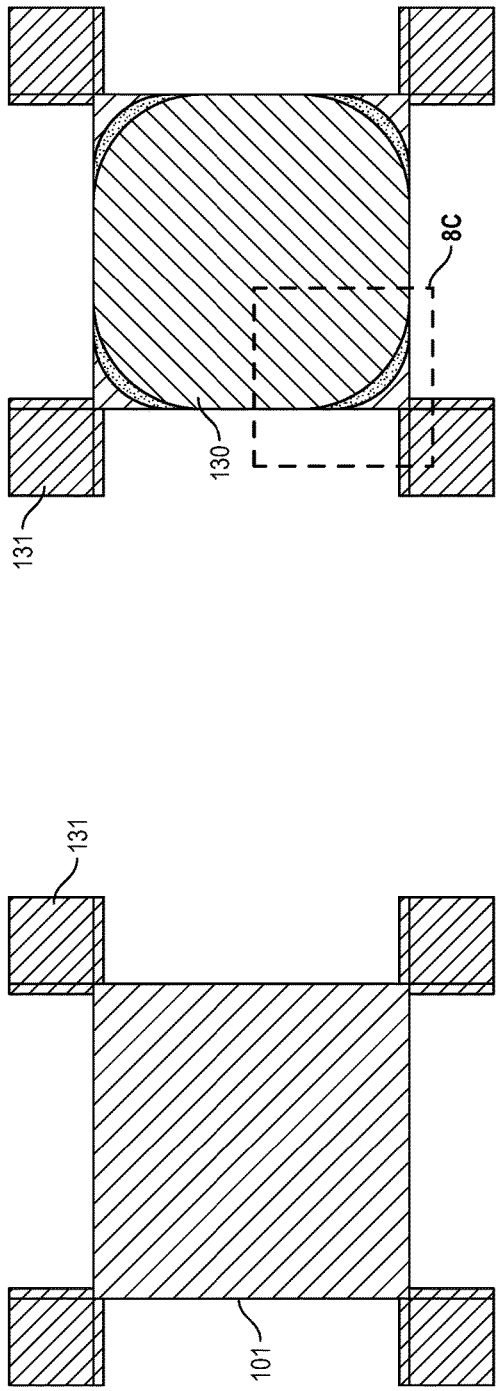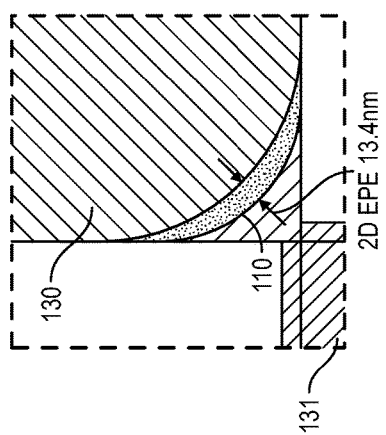
FIG. 8A (Prior Art)
FIG. 8B (Prior Art)
FIG. 8C (Prior Art)

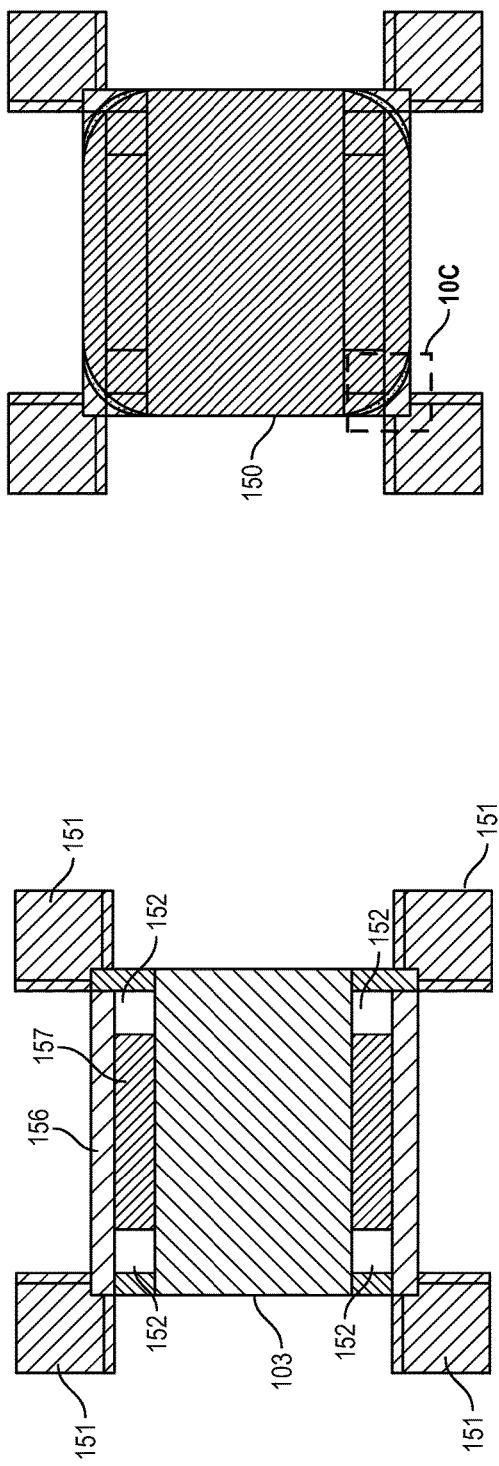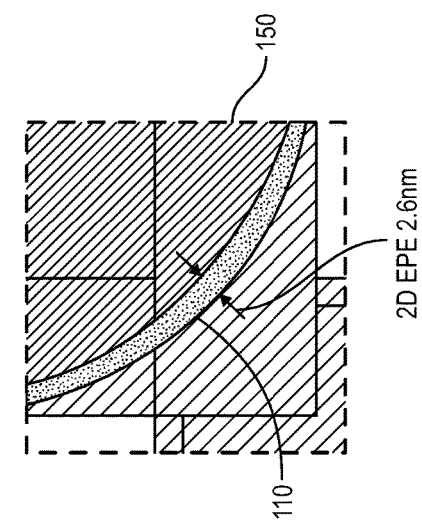
FIG. 10A  FIG. 10B  FIG. 10C

MINIMUM INTERNAL SRAF SIZE A =38-40nm
MAXIMUM C = 80nm

ISOLATED CONTACTS(SIZE FROM 250nm ~1000nm )

| D | 250nm | 300nm | 350nm | 400nm | 450nm | 500nm | 600nm | 800nm | 1000nm |
|---|---|---|---|---|---|---|---|---|---|
| A | 40nm | 40nm | 40nm | 40nm | 40nm | 40nm | 40nm | 40nm | 40nm |
| B | 111nm | 110nm | 110nm | 110nm | 110nm | 110nm | 110nm | 110nm | 110nm |
| C | 80nm | 80nm | 80nm | 80nm | 80nm | 80nm | 80nm | 80nm | 80nm |

⎫ 240

THROUGH PITCHES (CONTACT SIZE 300x300nm)

| P | 450nm | 500nm | 550nm | 600nm | 650nm | 700nm | 800nm | 900nm | 1100nm |
|---|---|---|---|---|---|---|---|---|---|
| A | 48nm | 38nm | 42nm | 40nm | 40nm | 40nm | 40nm | 40nm | 40nm |
| B | 88.8nm | 100.5nm | 110nm | 110nm | 110nm | 110nm | 110nm | 110nm | 110nm |
| C | 58.4nm | 80nm | 80nm | 80nm | 80nm | 80nm | 80nm | 80nm | 80nm |

⎫ 241

STAGGER ARRAY (CONTACT SIZE 300x300nm)

| P | 400nm | 450nm | 500nm | 550nm | 600nm | 650nm | 700nm | 800nm | 900nm |
|---|---|---|---|---|---|---|---|---|---|
| A | 46nm | 40nm | 40nm | 40nm | 40nm | 40nm | 40nm | 40nm | 40nm |
| B | 99.6nm | 106nm | 110nm | 110nm | 110nm | 110nm | 110nm | 110nm | 110nm |
| C | 56nm | 76nm | 80nm | 80nm | 80nm | 80nm | 80nm | 80nm | 80nm |

⎫ 242

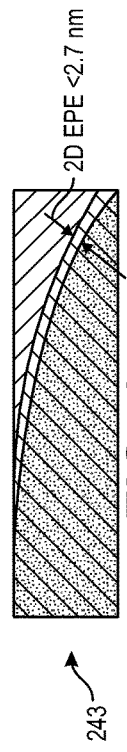

243 — 2D EPE <2.7 nm

FIG. 15

MINIMUM INTERNAL SRAF SIZE A =35nm
MAXIMUM C = 90nm

ISOLATED CONTACTS(SIZE FROM 250nm ~1000nm)

| D | 250nm | 300nm | 350nm | 400nm | 450nm | 500nm | 600nm | 800nm | 1000nm |
|---|---|---|---|---|---|---|---|---|---|
| A | 35nm | 35nm | 35nm | 35nm | 35nm | 35nm | 35nm | 35nm | 35nm |
| B | 112.5nm | 112.6nm | 112.6nm | 112.6nm | 112.6nm | 112.6nm | 112.6nm | 112.6nm | 112.6nm |
| C | 90nm | 90nm | 90nm | 90nm | 90nm | 90nm | 90nm | 90nm | 90nm |

⎫ 250

THROUGH PITCHES (CONTACT SIZE 300x300nm)

| P | 450nm | 500nm | 550nm | 600nm | 650nm | 700nm | 800nm | 900nm | 1100nm |
|---|---|---|---|---|---|---|---|---|---|
| A | 48nm | 38nm | 38nm | 35nm | 35nm | 35nm | 35nm | 35nm | 35nm |
| B | 88.8nm | 100.5nm | 112nm | 112.6nm | 112.6nm | 112.6nm | 112.6nm | 112.6nm | 112.6nm |
| C | 58.4nm | 80nm | 90nm | 90nm | 90nm | 90nm | 90nm | 90nm | 90nm |

⎫ 251

STAGGER ARRAY (CONTACT SIZE 300x300nm)

| P | 400nm | 450nm | 500nm | 550nm | 600nm | 650nm | 700nm | 800nm | 900nm |
|---|---|---|---|---|---|---|---|---|---|
| A | 46nm | 40nm | 35nm | 35nm | 35nm | 35nm | 35nm | 35nm | 35nm |
| B | 99.6nm | 106nm | 112.6nm | 112.6nm | 112.6nm | 112.6nm | 112.6nm | 112.6nm | 112.6nm |
| C | 56nm | 76nm | 90nm | 90nm | 90nm | 90nm | 90nm | 90nm | 90nm |

⎫ 252

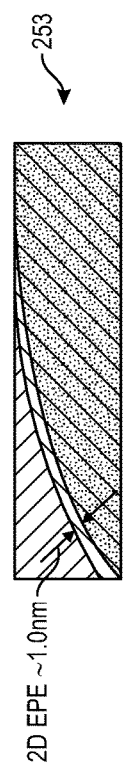

2D EPE ~1.0nm — 253

FIG. 16

MINIMUM INTERNAL SRAF SIZE A = 35nm
MAXIMUM C = 100nm

260: ISOLATED CONTACTS (SIZE FROM 250nm ~1000nm)

| D | 250nm | 300nm | 350nm | 400nm | 450nm | 500nm | 600nm | 800nm | 1000nm |
|---|-------|-------|-------|-------|-------|-------|-------|-------|--------|
| A | 30nm | 30nm | 30nm | 30nm | 30nm | 30nm | 30nm | 30nm | 30nm |
| B | 116.7nm | 116.7nm | 116.7nm | 112.6nm | 116.7nm | 116.7nm | 116.7nm | 116.7nm | 116.7nm |
| C | 100nm | 100nm | 100nm | 100nm | 100nm | 100nm | 100nm | 100nm | 100nm |

261: THROUGH PITCHES (CONTACT SIZE 300x300nm)

| P | 450nm | 500nm | 550nm | 600nm | 650nm | 700nm | 800nm | 900nm | 1100nm |
|---|-------|-------|-------|-------|-------|-------|-------|-------|--------|
| A | 48nm | 38nm | 38nm | 35nm | 30nm | 30nm | 30nm | 30nm | 30nm |
| B | 88.8nm | 100.5nm | 112nm | 112.6nm | 112.6nm | 112.6nm | 112.6nm | 112.6nm | 112.6nm |
| C | 58.4nm | 80nm | 90nm | 90nm | 100nm | 100nm | 100nm | 100nm | 100nm |

262: STAGGER ARRAY (CONTACT SIZE 300x300nm)

| P | 400nm | 450nm | 500nm | 550nm | 600nm | 650nm | 700nm | 800nm | 900nm |
|---|-------|-------|-------|-------|-------|-------|-------|-------|-------|
| A | 46nm | 40nm | 35nm | 30nm | 30nm | 30nm | 30nm | 30nm | 30nm |
| B | 99.6nm | 106nm | 112.6nm | 112.6nm | 112.6nm | 112.6nm | 112.6nm | 112.6nm | 112.6nm |
| C | 56nm | 76nm | 90nm | 100nm | 100nm | 100nm | 100nm | 100nm | 100nm |

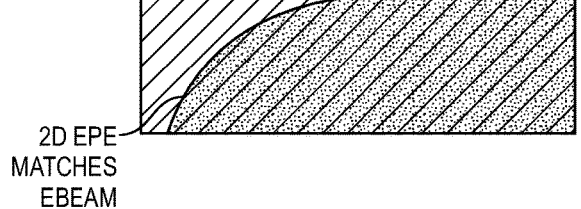

2D EPE MATCHES EBEAM — 263

FIG. 17

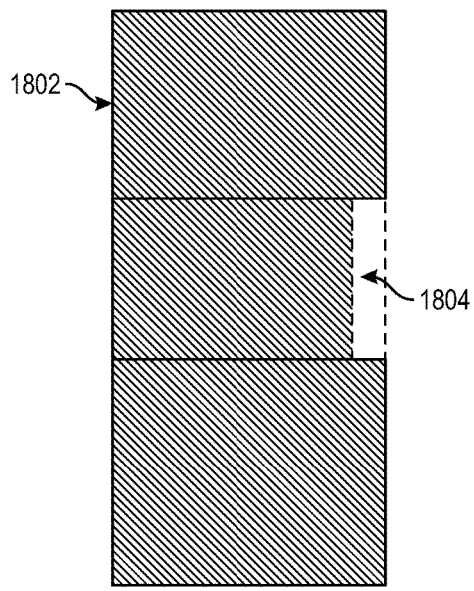
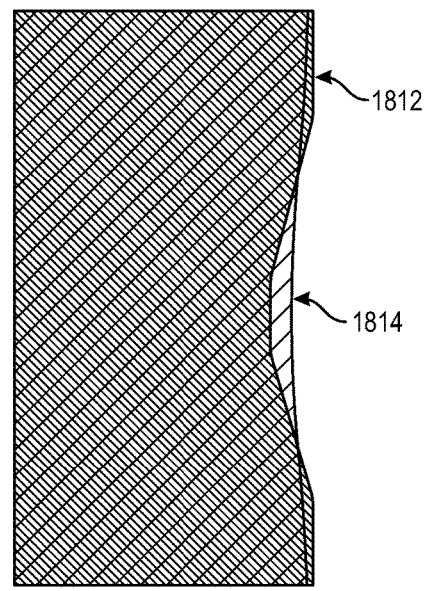
FIG. 18A  FIG. 18B
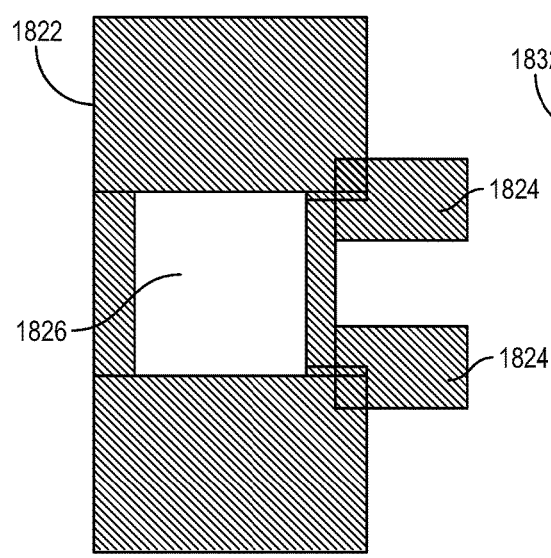
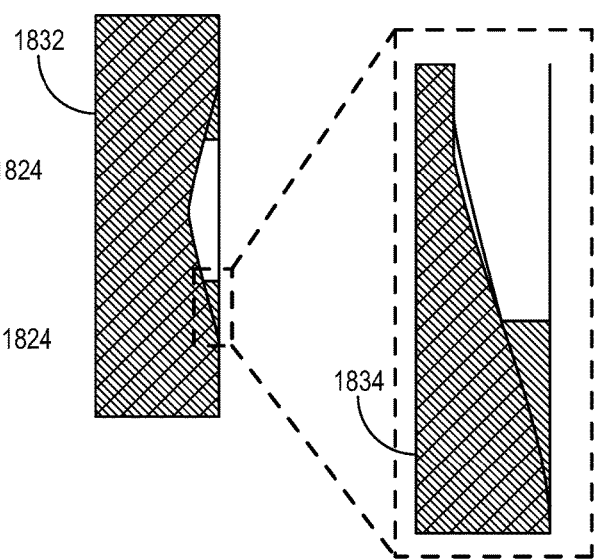
FIG. 18C  FIG. 18D

SUB-RESOLUTION ASSIST FEATURES IN SEMICONDUCTOR PATTERN WRITING

RELATED APPLICATIONS

This application claims priority to U.S. Provisional Patent Application No. 62/393,509, filed on Sep. 12, 2016 and entitled "Sub-Resolution Assist Features in Semiconductor Pattern Writing"; the contents of which are fully incorporated by reference herein.

BACKGROUND OF THE DISCLOSURE

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks or even other reticles. While conventional optical lithography uses a light source having a wavelength of 193 nm, extreme ultraviolet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection. Shaped beam charged particle beam lithography may use either a single shaped beam, or may use a plurality of shaped beams simultaneously exposing the surface, the plurality of shaped beams producing a higher writing speed than a single shaped beam.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of predetermined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimensions of its corresponding mask pattern approaches the resolution limit of the optical exposure tool used in optical lithography. As the critical dimensions of the circuit pattern become smaller and approach the resolution value of the exposure tool, the accurate transcription between the mask pattern and the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the original mask pattern to compensate for distortions caused by effects such as optical diffraction and the optical interaction of features with proximate features. OPC includes all resolution enhancement technologies performed with a reticle.

OPC adds sub-resolution lithographic features to mask patterns to reduce differences between the original mask pattern, that is, the design, and the final transferred circuit pattern on the substrate. The sub-resolution lithographic features interact with the original mask pattern and with each other and compensate for proximity effects to improve the final transferred circuit pattern. One feature that is used to improve the transfer of the pattern is a sub-resolution assist feature (SRAF). Another feature that is added to improve pattern transference is referred to as "serifs." Serifs are small features that can be positioned on a corner of a pattern to sharpen the corner in the final transferred image. As the limits of optical lithography are being extended far into the sub-wavelength regime, the OPC features must be made more and more complex in order to compensate for even more subtle interactions and effects. However, as imaging systems are pushed closer to their limits, the ability to produce reticles with sufficiently fine OPC features becomes critical. Although adding serifs or other OPC features to a mask pattern is advantageous, it also substantially increases the total features count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

Optical lithography may also be used to form patterns on a reticle, using a laser writer. In laser writing a focused laser beam is raster scanned across the surface to form the pattern. Optical lithography has a lower resolution than does charged particle beam lithography for forming patterns on a reticle. OPC techniques described above may therefore be used to enhance resolution of the formed patterns.

SUMMARY OF THE DISCLOSURE

In some embodiments, a method for optical proximity correction includes inputting a physical design having a plurality of shapes. Each shape has a plurality of corners, and the physical design is to be exposed on a surface of a substrate. A set of sub-resolution assist features (SRAFs) for the physical design is determined, where a plurality of SRAFs in the set of SRAFs interact. The plurality of SRAFs together provide better dimensional control of one corner of one shape in the plurality of shapes, when exposed on the substrate, compared to using a single SRAF to control a dimension of the one corner. The plurality of SRAFs includes a positive SRAF and a negative SRAF. A modified physical design is output, where the modified physical design comprises the physical design, as modified by the set of SRAFs.

In some embodiments, a method for forming a reticle pattern on a resist-coated reticle includes inputting a physical design having a plurality of shapes. Each shape has a plurality of corners, and the physical design is to be exposed on a surface of a substrate. A set of sub-resolution assist features (SRAFs) for the physical design is determined, where a plurality of SRAFs in the set of SRAFs interact. The plurality of SRAFs together provide better dimensional control of one corner of one shape in the plurality of shapes, when exposed on the substrate, compared to using a single SRAF to control a dimension of the one corner. The plurality of SRAFs includes a positive SRAF and a negative SRAF. A modified physical design is output, where the modified physical design includes the input physical design modified by the set of SRAFs. A pattern is formed on the resist-coated reticle with the modified physical design.

In some embodiments, a system for optical proximity correction includes a device configured to add a set of sub-resolution assist features (SRAFs) to a physical design. The physical design is to be exposed on a surface of a substrate and includes a plurality of shapes. Each shape comprises a plurality of corners. The device is configured to determine a plurality of SRAFs to improve dimensional control on one corner of one shape in the plurality of shapes, compared to using a single SRAF to provide dimensional control of the one corner. The plurality of SRAFs includes a positive SRAF and a negative SRAF.

BRIEF DESCRIPTION OF THE DRAWINGS

FIGS. 8A-8C illustrate serifs applied to corners of a contact, according to conventional techniques;

FIGS. 10A-10D show another embodiment of using sub-resolution assist features in accordance with some embodiments;

FIG. 15 shows example simulated contact results in accordance with some embodiments;

FIG. 16 shows further examples of simulated contact results in accordance with some embodiments;

FIG. 17 shows yet further examples of simulated contact results in accordance with some embodiments;

FIG. 18A-18D illustrates sub-resolution assist features used in a jog feature, in accordance with some embodiments;

DETAILED DESCRIPTION OF THE EMBODIMENTS

Laser mask writers are often used to produce masks for semiconductor printing, particularly for layers where tolerances are looser and do not require the precision of electron bean writers. In the present disclosure, accuracy of writing patterns with laser mask writers is improved by enhancing corner rounding through the use of positive and negative SRAFs. Since the side walls of contacts provide the surface area for wiring, reducing corner rounding improves performance of an integrated circuit by improving the squareness of these side walls, thus increasing the side wall surface area of contacts.

Figure 1:
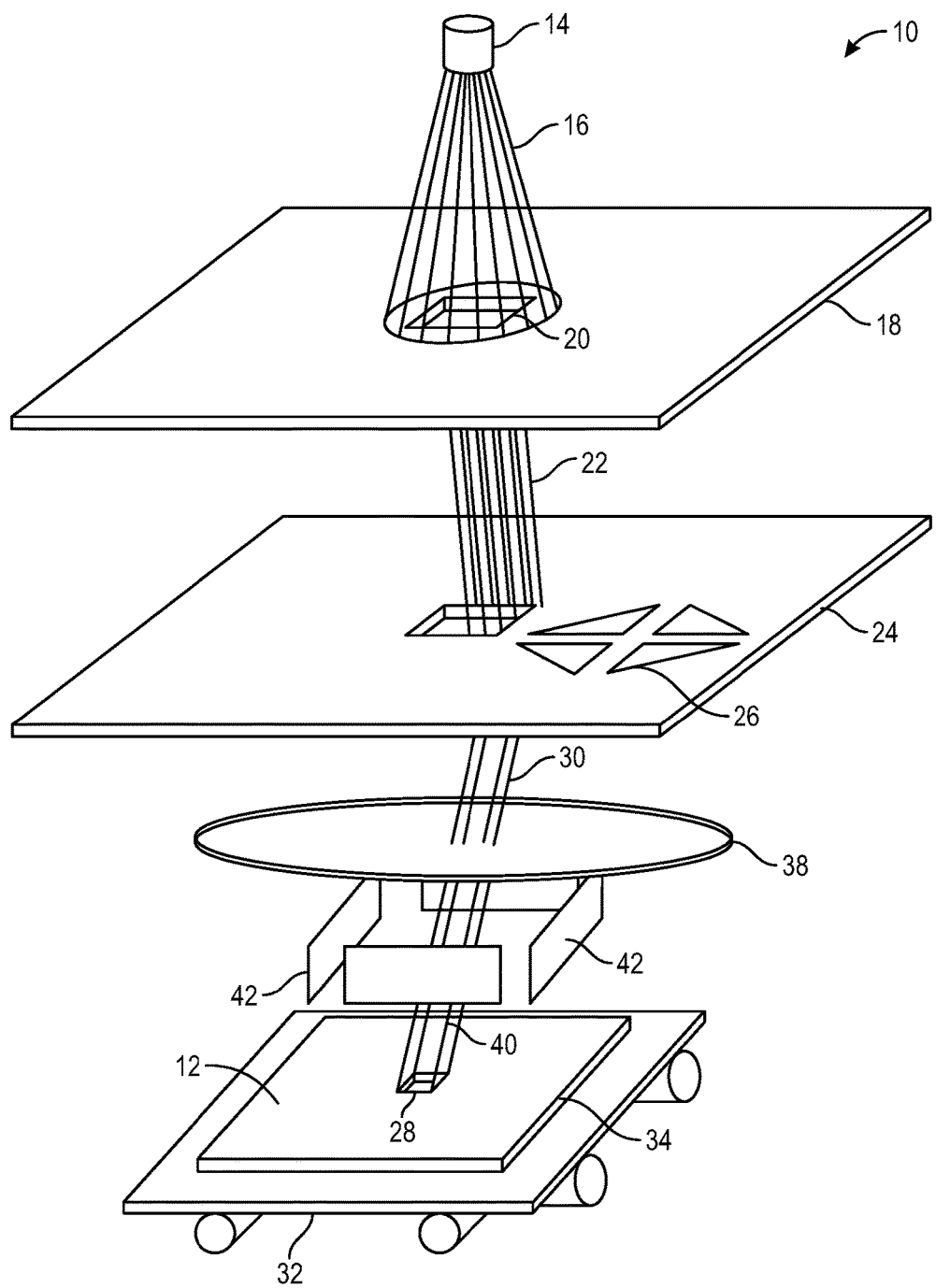
FIG. 1 illustrates a variable shaped beam charged particle beam writer system used to manufacture a surface.

Referring now to the drawings, wherein like numbers refer to like items, FIG. 1 identifies an embodiment of a lithography system, such as a charged particle beam writer system, in this case an electron beam writer system 10, that employs a variable shaped beam (VSB) to manufacture a surface 12. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil mask 24 has formed therein a number of apertures 26 that define various simple shapes such as rectangles and triangles. Each aperture 26 formed in the stencil mask 24 may be used to form a pattern in the surface 12 of a substrate 34, such as a silicon wafer, a reticle or other substrate. An electron beam 30 emerges from one of the apertures 26 and passes through an electromagnetic or electrostatic reduction lens 38, which reduces the size of the pattern emerging from the aperture 26. In commonly available charged particle beam writer systems, the reduction factor is between 10 and 60. The reduced electron beam 40 emerges from the reduction lens 38 and is directed by a series of deflectors 42 onto the surface 12 as a pattern 28. Blanking plates (not shown) are used to deflect the beam 16 or the shaped beam 22 so to prevent the electron beam from reaching the surface 12 during a period after each shot when the lenses directing the beam 22 and the deflectors 42 are being re-adjusted for the succeeding shot. Typically the blanking plates are positioned so as to deflect the electron beam 16 to prevent it from illuminating aperture 20. Conventionally, the blanking period may be a fixed length of time, or it may vary depending, for example, on how much the deflector 42 must be re-adjusted for the position of the succeeding shot.

In electron beam writer system 10, the substrate 34 is mounted on a movable platform or stage 32. The stage 32 allows substrate 34 to be repositioned so that patterns which are larger than the maximum deflection capability or field size of the charged particle beam 40 may be written to surface 12 in a series of subfields, where each subfield is within the capability of deflector 42 to deflect the beam 40. In one embodiment the substrate 34 may be a reticle. In this embodiment, the reticle, after being exposed with the pattern, undergoes various manufacturing steps through which it becomes a lithographic mask or photomask.

Figure 2:
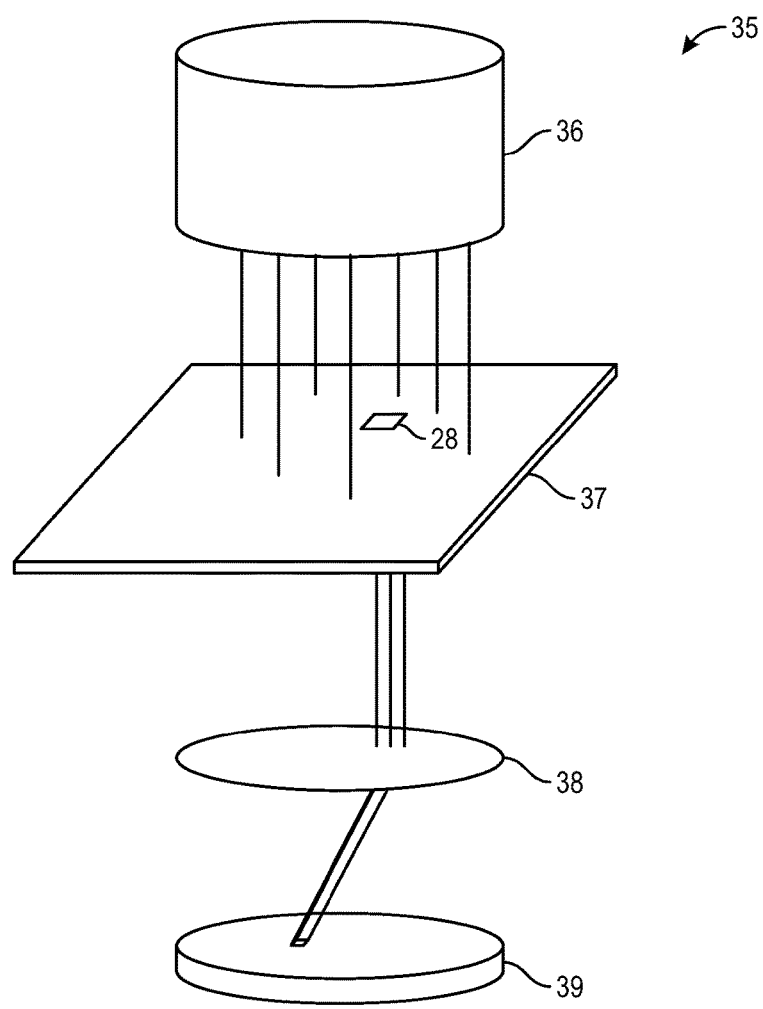
FIG. 2 illustrates an optical lithography system.

The mask may then be used in an optical lithography device or machine 35, illustrated in FIG. 2. The optical lithography machine 35 comprises an illumination source 36, the mask 37, and one or more lenses 38 which project an image of the reticle pattern 28, generally reduced in size, onto a substrate 39, such as a silicon wafer, to produce an integrated circuit. More generally, the mask 37 is used in another device or machine to transfer the pattern 28 onto substrate 39.

Figure 3A:
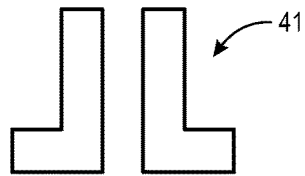
FIG. 3A illustrates a design of a pattern to be placed on a substrate.
Figure 3B:
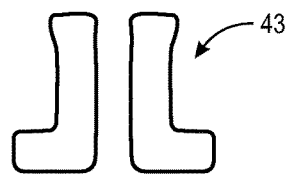
FIG. 3B illustrates a pattern formed in a reticle from the design shown in FIG. 3A.
Figure 3C:
FIG. 3C illustrates a pattern formed in the photoresist of a substrate using the reticle of FIG. 3B.

As indicated above, since semiconductor and other nanotechnology manufacturers are reaching the limits of optical lithography, it is difficult to transfer an ideal pattern onto a substrate. For example, FIG. 3A illustrates an ideal pattern 41, which represents a circuit, to be formed in the resist of a substrate. When a reticle and mask are produced that attempt to have the pattern 41 formed thereon, the reticle is not a perfect representation of the pattern 41. A pattern 43 that may be formed in a reticle that attempts to represent the pattern 40 is shown in FIG. 3B. The pattern 43 has more rounded and shortened features as compared to the pattern 41. When the pattern 43 is employed in the optical lithography process, a pattern 44 is formed in the photoresist on the substrate as depicted in FIG. 3C. The pattern 44 is not very close to the ideal pattern 41, demonstrating why optical proximity correction is required.

Figure 4A:
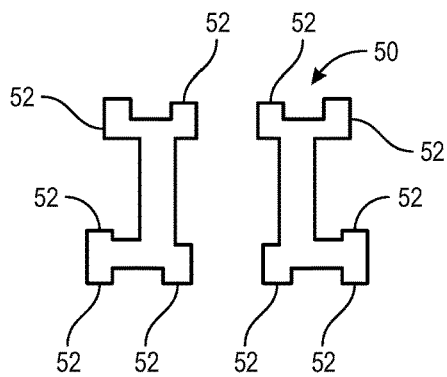
FIG. 4A illustrates an optical proximity corrected version of the pattern shown in FIG. 3A.
Figure 4B:
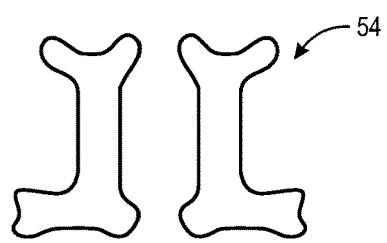
FIG. 4B illustrates an optical proximity corrected version of the pattern shown in FIG. 4A after it is formed in the reticle.
Figure 4C:
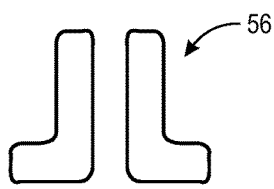
FIG. 4C illustrates a pattern formed in the photoresist of a silicon wafer using the reticle of FIG. 4B.

In an effort to compensate for the difference between the patterns 41 and 44, optical proximity correction is commonly used. Optical proximity correction alters the design pattern so as to alter the reticle to compensate for distortions created by optical diffraction, optical interactions with neighboring shapes, and resist process effects. FIGS. 4A-4C show how optical proximity correction can be employed to enhance the optical lithography process to develop a better version of the pattern 44. In particular, FIG. 4A illustrates a pattern 50 that is an altered version of the pattern 40. The pattern 50 has a serif element 52 added to various corners of the pattern 50 to provide extra area in an attempt to reduce optical and processing effects that reduce the sharpness of the corner. When a reticle of the pattern 50 is produced it may appear in the reticle as a pattern 54 as shown in FIG. 4B. When the optical proximity corrected pattern 54 is used in an optical lithography device an output pattern 56, as depicted in FIG. 4C, is produced. The pattern 56 more resembles the ideal pattern 40 than the pattern 44 and this is due to optical proximity correction. Although using optical proximity correction is helpful, it may require that every pattern be altered or decorated which increases the time and cost to produce a reticle. Also, the various patterns formed on the reticle may properly have slight differences between them when OPC is applied and this adds to the time and expense in preparing a reticle.

Figure 5:
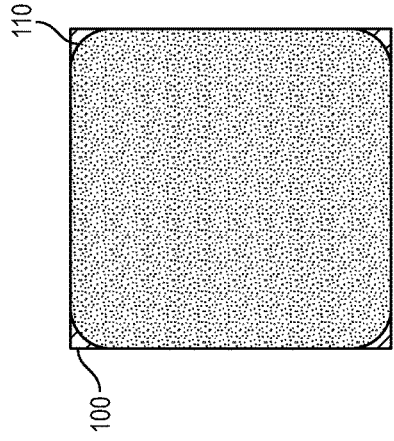
FIG. 5 illustrates pattern formation using a raster-scan method.

Masks may also be manufactured using a laser writer to form patterns on a reticle, instead of an electron beam writer system. A common laser writer forms patterns by raster-scanning, as illustrated in FIG. 5. One or more Gaussian or shaped beams 92 is scanned across the reticle surface to form a pattern 90. Although the exposure method is raster-scanning, the input data to laser writers is commonly shape-based. In some laser writers, input patterns may be restricted to trapezoids with horizontal bases, as illustrated in FIG. 5. Laser writers commonly use lasers with wavelengths between 250 and 400 nm. Consequently, resolution of a laser writer is substantially less than of an electron beam writer system. Optical proximity correction (OPC) techniques, such as use of serifs 52 in FIG. 4A, may therefore be used during mask writing to enhance the resolution of the pattern on the mask.

In the present disclosure, corner rounding for patterns written with laser writers are enhanced, making the corners as close as possible in precision to electron beam ("eBeam") writers. In general, a 300 nm×300 nm contact will be illustrated for demonstration purposes, using a simplified rotation symmetric Gaussian model. In some embodiments, the geometry corrections disclosed herein can be implemented on laser writers with dose modulation (partial pixels).

Figure 6:
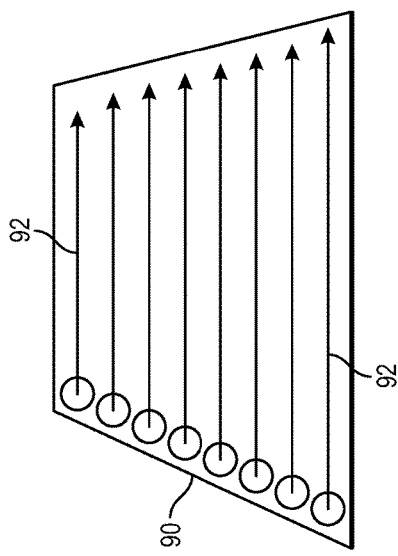
FIG. 6 illustrates a simulated contact printed with an eBeam writer.

FIG. 6 illustrates a simulated contact 110 as known in the art, exposed or printed with an eBeam writer. The desired square contact 100 has a size of 300×300 nm. In the simulation of FIG. 6, a 30 nm beam blur is used. FIG. 6 illustrates that corner rounding occurs in the eBeam-printed contact 110 compared to the desired contact pattern 100.

Figure 7A:
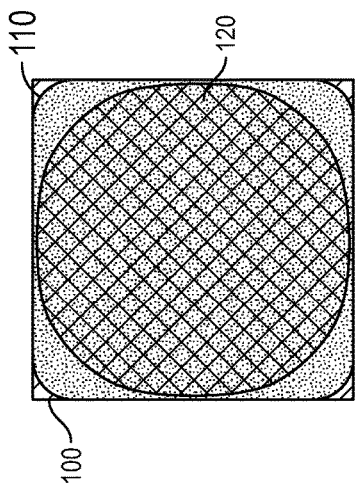
FIGS. 7A-7B illustrate a simulated contact printed with a laser writer, with no corner correction applied.
Figure 7B:
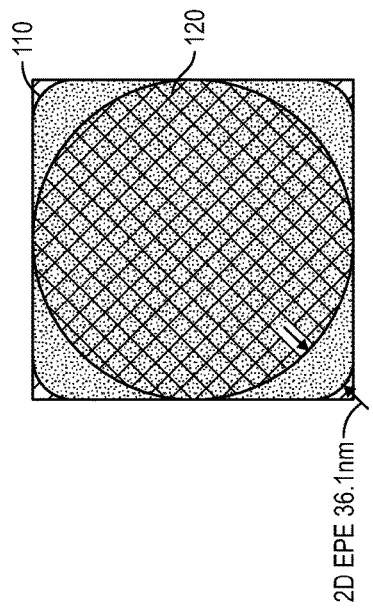

FIGS. 7A-7B illustrate a simulated contact 120 as known in the art, exposed by a laser writer, with no OPC applied. The desired contact size 100 is again 300×300 nm. The simulation assumes that the manufacturing process is biased so that the maximum X or Y dimension of the exposed pattern is 300 nm. FIG. 7A shows that the laser-written contact 120 has even more corner rounding compared to the eBeam contact 110. The difference between the eBeam-simulated contact 110 and the laser-simulated contact 120 is designated as a two-dimensional error (2D EPE), having a value of 36.1 nm as shown in FIG. 7B.

FIGS. 8A-8C illustrate the application of serifs to the corners of the contact, as is known in the art. FIG. 8A illustrates a target area 101, which is the desired contact 100 with the addition of square serifs 131 slightly overlapping each corner. FIGS. 8B-8C show a simulated contact 130 which results from writing target area 101 using a laser writer. In contact 130, the 2D EPE is 13.4 nm relative to the eBeam-simulated contact 110 from FIG. 6. The 2D EPE of 13.4 nm in the close-up view of FIG. 8C is less than the 2D EPE of 36.1 nm in FIG. 7B. Thus, accuracy of the contact 130 using serifs is improved compared to simulated contact 120 that was written without serifs.

Figure 9A:
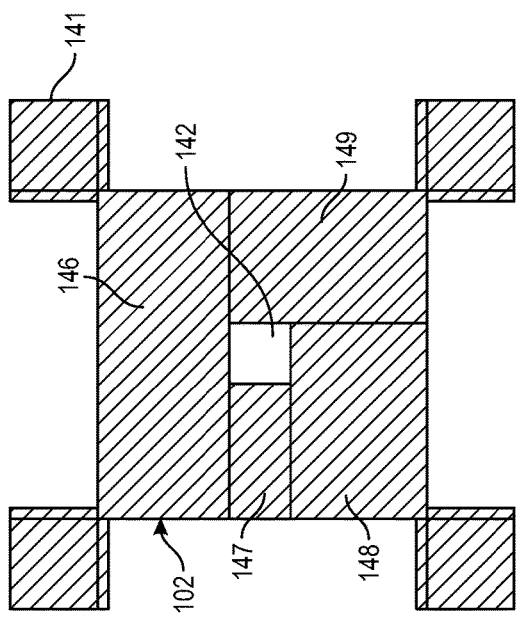
FIGS. 9A-9C illustrate the use of sub-resolution assist features in accordance with some embodiments.
Figure 9B:
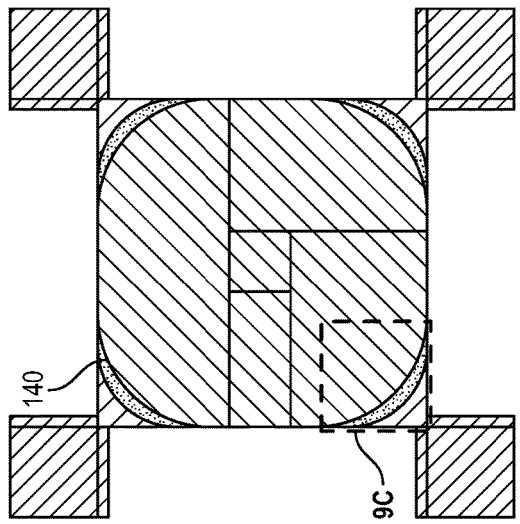
Figure 9C:
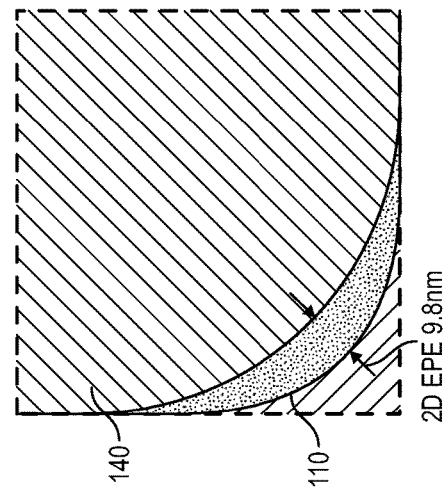

In the present embodiments, combinations of positive and negative SRAFs are used to improve the accuracy of writing patterns compared to the above-described conventional techniques. FIGS. 9A-9C demonstrate the use of a negative SRAF according to some embodiments. FIG. 9A illustrates a target area 102, which consists of rectangular areas 146, 147, 148 and 149, plus a serif 141 slightly overlapping each outside corner of the area defined by rectangles 146, 147, 148, and 149. Excluding the serifs 141, the external dimension of target area 102 is 300×300 nm, as in FIG. 6 contact 100. The target area 102 is similar to FIG. 8A target area 101, with the exception that in the target area 102 of FIG. 9A, a negative SRAF 142 has been added at the center of the target area 102. The negative SRAF 142 is a hole or space on which a pattern is not written. Since negative shapes may not be available as a figure type in a particular laser writer input data format, the negative SRAF 142 may be represented by, for example, the four rectangular patterns 146, 147, 148 and 149 whose edges form the interior open space of negative SRAF 142 in FIG. 9A. FIG. 9B shows a simulated contact 140 which results from writing target area 102 using a laser writer. The close-up view of FIG. 9C shows that with the serifs 141 and negative SRAF 142, the worst 2D EPE of simulated contact 140 at the corner is about 9.8 nm compared to the eBeam-simulated contour 110. Thus, the internal, negative SRAF 142 at the center of the target area 102 further improves the printing accuracy of the contact 100, compared to the conventional exposure area 101 of FIG. 8A.

Figure 10D:
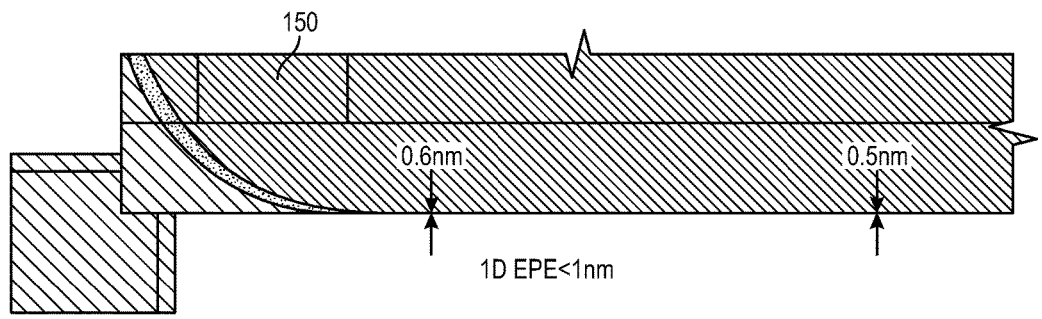

FIGS. 10A-10D illustrate another embodiment, using multiple internal SRAFs near the corners. FIG. 10A illustrates target area 103, which includes serifs 151 at each outside corner, and with a negative SRAF 152 near each serif 151. The negative SRAFs 152 can be created by subdividing the target area 103 into smaller areas such as rectangular patterns 156 and 157 of FIG. 10A. In one embodiment, for an isolated contact, 110 nm serifs 151 are placed outside and slightly overlapping each corner, and 40 nm square negative SRAFs are placed 20 nm inside of the desired square corner, in both X and Y dimension. FIGS. 10B-10C show a simulated contact 150 which results from writing target area 103 using a laser writer. FIG. 10C illustrates a portion of simulated contact 150, and shows the resulting 2D EPE of 2.6 nm compared to the eBeam-written contour 110. FIG. 10D shows that simulated contact 150 has a one-dimensional error (1D EPE) of less than 1 nm. Experimental simulations have shown that with a further increase in the serif size, while reducing the internal SRAF size, even smaller 2D EPE errors may be obtained. The dimensions of the serifs and the negative SRAFs may be optimized such that the 2D EPE of the laser writer contour will match the eBeam writer contour.

Figure 11:
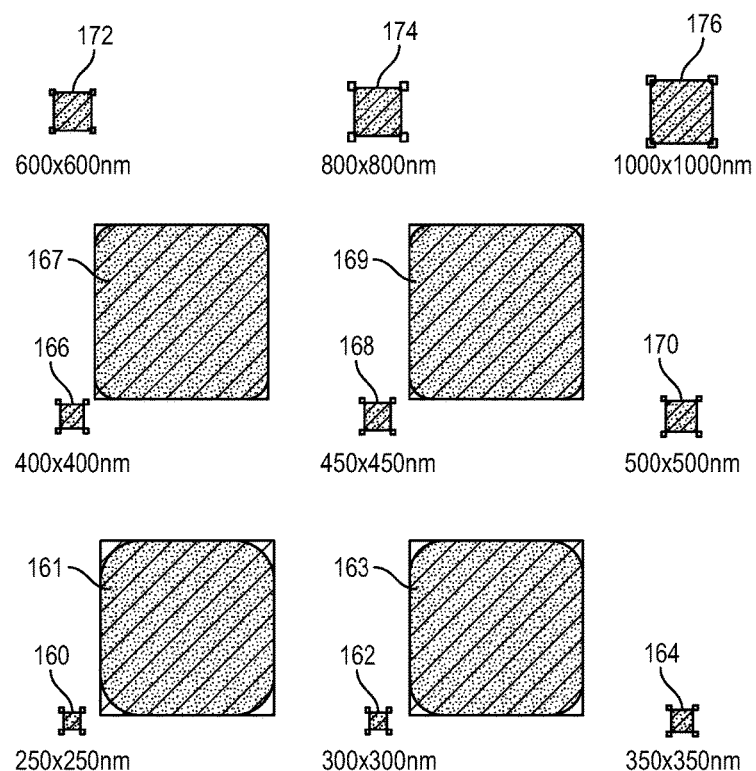
FIG. 11 demonstrates different contact sizes using corrections in accordance with some embodiments.

FIG. 11 illustrates target patterns for contacts of different sizes, with OPC enhancements using the correction scheme of FIG. 10A, in which a serif and an internal negative SRAF are used near each corner of the target area. Exclusive of OPC enhancements, target pattern 160 is 250 nm square, target pattern 162 is 300 nm square, target pattern 164 is 350 nm square, target pattern 166 is 400 nm square, target pattern 168 is 450 nm square, target pattern 170 is 500 nm square, target pattern 172 is 600 nm square, target pattern 174 is 800 nm square, and target pattern 176 is 1,000 nm square. Additionally, simulated exposures of some of the target patterns are illustrated, showing examples of the minimal corner rounding that can be achieved using serifs and internal negative SRAFs according to the present embodiments. The simulated contacts include contact 161, which is a simulation of target pattern 160, a simulated contact 163 from target pattern 162, a simulated contact 167 from target pattern 166, and a simulated contact 169 from target pattern 168, all illustrating the minimal corner rounding that is achieved. Simulations show that optimal dimensions and locations of the serifs and negative SRAFs vary little as the contact size is increased from 300 nm to 1000 nm.

The use of serifs with negative SRAFs may also be used to reduce corner rounding for non-isolated patterns, such as patterns which form arrays of contacts. Simulation should be used to determine the optimal size and locations for the serifs and SRAFs in these configurations.

In the present methods, the use of negative SRAFs is counterintuitive to conventional techniques. Serifs are positive SRAFs, commonly used in industry to add exposure energy to corners by adding patterned areas in addition to the original pattern, thus reducing the amount of filleting or corner rounding that occurs. The concept of removing energy—by using negative SRAFs—in areas in which additional energy is desired is contrary to known methods. The use of negative SRAFs also increases the complexity of computations, since due to the limitations of common data representations, an original single target pattern must normally be subdivided into a plurality of smaller patterns to create the negative SRAFs. The increased number of patterns of the present embodiments in which negative SRAFs are utilized, compared to not using a negative SRAF, increases the computational complexity.

Figure 12:
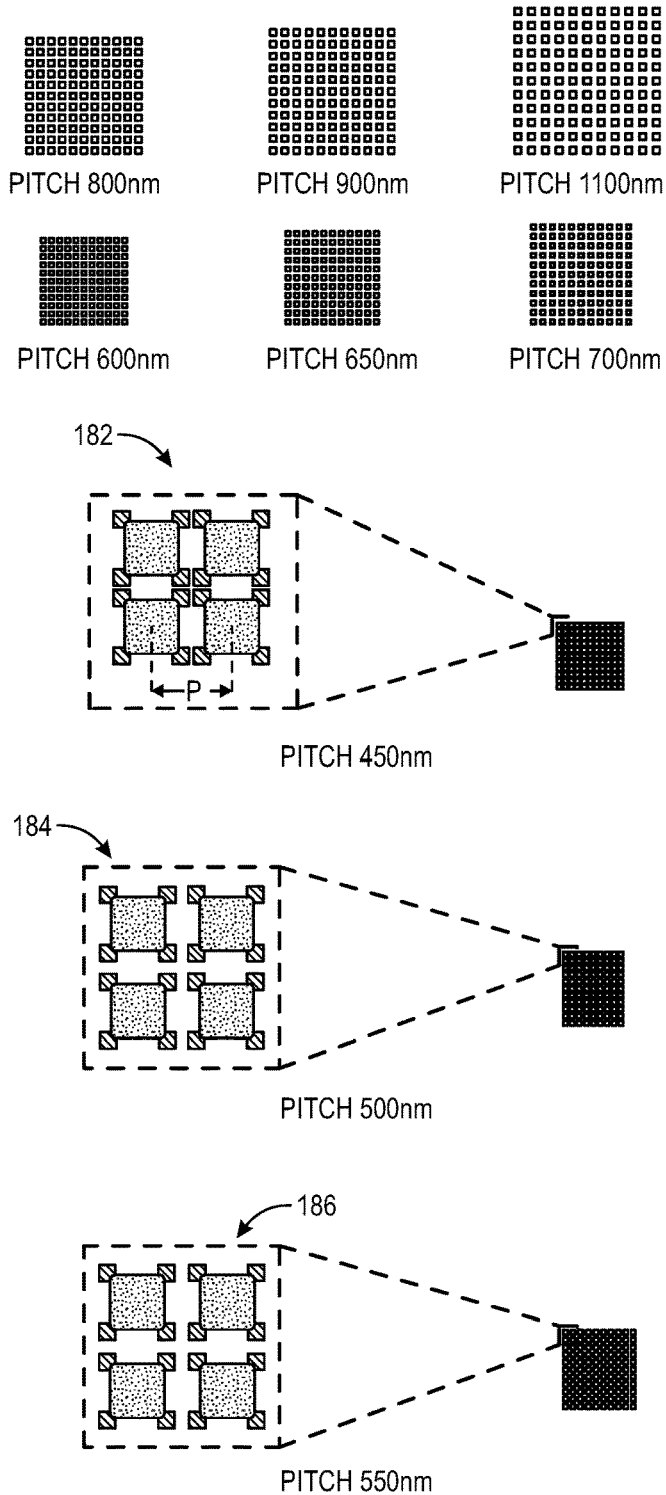
FIG. 12 illustrates simulations of aligned contact arrays in accordance with some embodiments.
Figure 13:
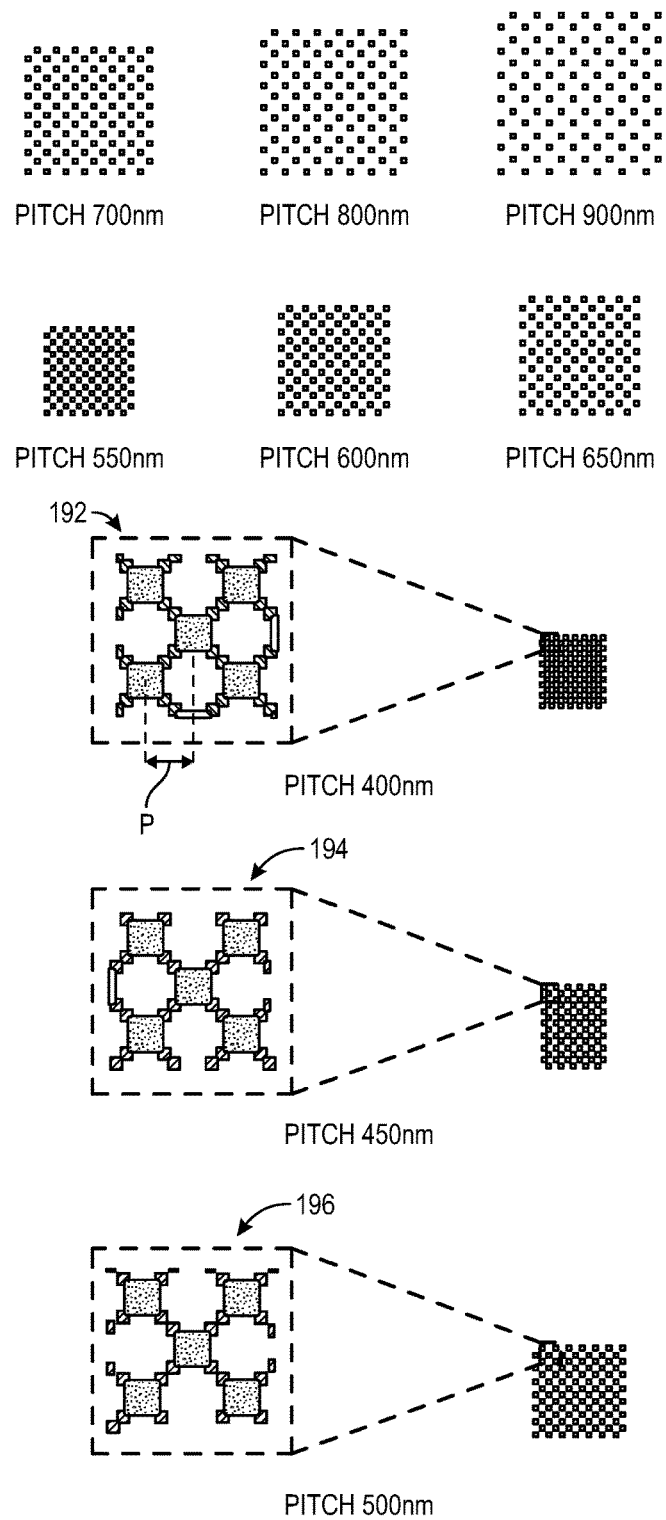
FIG. 13 illustrates simulations of staggered contact arrays in accordance with some embodiments.

FIGS. 12-13 demonstrate the simulation of pitched contact arrays in the present techniques of using negative SRAFs in conjunction with positive SRAFs. FIG. 12 illustrates resulting laser-written contacts for various pitches of an aligned ("through pitch") array. The center-to-center spacing of adjacent contacts is the pitch, denoted by "P" in element 182. The contact size is 300×300 nm, and the correction scheme is that of FIG. 10A in which a serif is used at each corner, and an internal negative SRAF is used near each corner. For internal corners—those not near the perimeter of the contact array—this results in a cluster of four serifs between corners of each main pattern. Example contact arrays with pitches of 450 nm, 500 nm, 550 nm, 600 nm, 650 nm, 700 nm, 800 nm, 900 nm, and 1100 nm are shown. Additionally, element 182 illustrates a magnified view of contacts arrayed at a 450 nm pitch, showing both the post-OPC target patterns and the simulated exposure. Similarly, element 184 illustrates a magnified view of contacts arrayed at a 500 nm pitch, and element 186 illustrates a magnified view of contacts arrayed at a 550 nm pitch. As can be seen in the magnified views 182, 184 and 186, the serifs are orthogonally aligned in this through-pitch array—i.e., the serifs of one contact are in-line horizontally or vertically with the serifs of an adjacent contact.

FIG. 13 illustrates laser-written contacts for staggered arrays of contacts of various pitches, where the contact size is 300×300 nm and the correction scheme is that of FIG. 10A. In these staggered arrays, the contacts are diagonally aligned along their corners. The center-to-center spacing of diagonally-adjacent contacts is the pitch, denoted by "P" in element 192. Example contact arrays with pitches of 400 nm, 450 nm, 500 nm, 550 nm, 600 nm, 650 nm, 700 nm, 800 nm, and 900 nm are shown. Additionally, element 192 illustrates a magnified view of staggered contacts arrayed at a 400 nm pitch, showing both the post-OPC target patterns and the simulated exposure. Similarly, element 194 illustrates a magnified view of staggered contacts arrayed at a 450 nm pitch, and element 196 illustrates a magnified view of staggered contacts arrayed at a 500 nm pitch. As can be seen in the magnified views 192, 194, and 196, the serifs of adjacent contacts are diagonally aligned with respect to each other.

Figure 14:
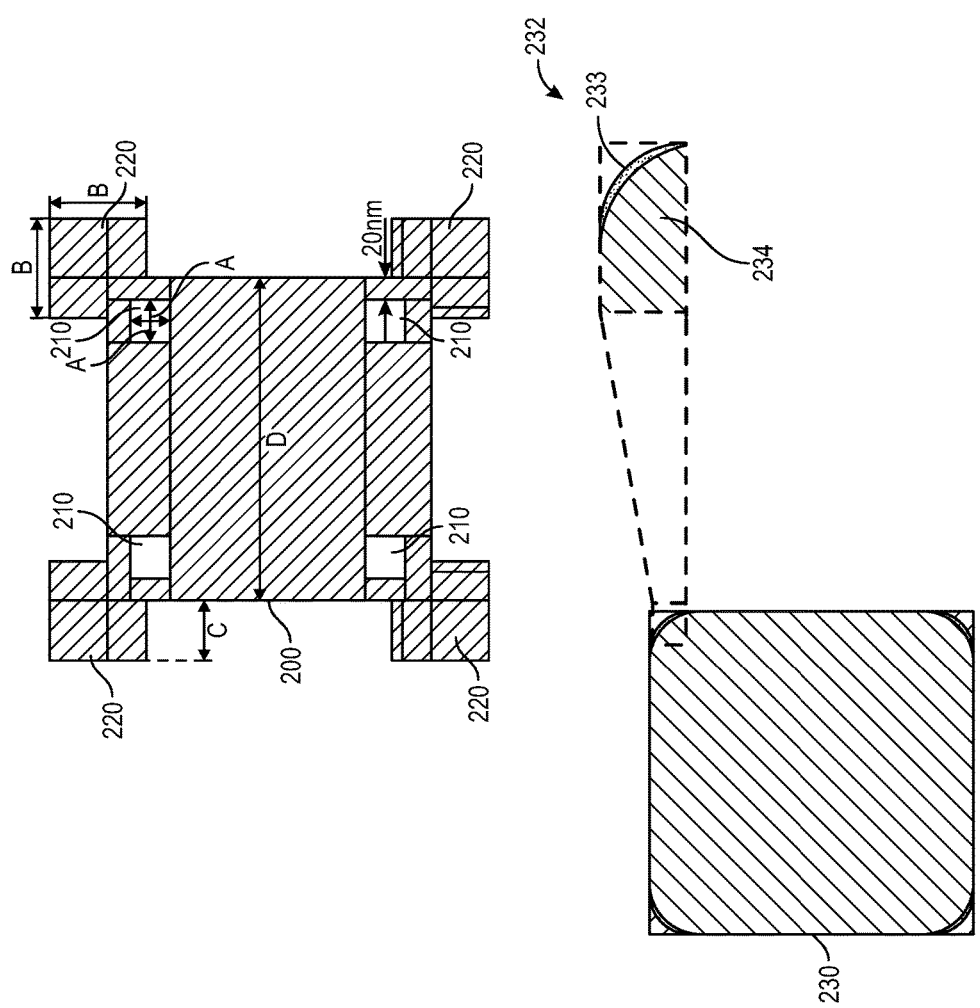
FIG. 14 shows details of a contact mask correction in accordance with some embodiments.

FIG. 14 defines further details about the contact mask size for the correction scheme of FIG. 10A. The target area 200 is a physical design to be exposed on a surface of a substrate. The substrate may be, for example, a reticle. For target area 200, the overall contact size exclusive of SRAFs is "D", each internal (negative) SRAF 210 has a length/width dimension "A," each external corner serif (positive SRAF) 220 has a length/width dimension "B," and the distance that the serifs 220 extend from the edge of the D×D square is dimension "C." Each negative SRAF 210 in this example is placed 20 nm in both x and y dimensions from the corner that it is modifying. In general, the negative SRAFs 210 can be closer to the one corner for which they are providing improved dimensional control, than to the other corners of the shape. The distance from the corner may be of various values depending on, for example, the overall size of the physical design that is being modified, the amount of dimensional control that is desired, and dosage modulation. The simulated contact is illustrated in element 230. The magnification 232 of the upper-right corner of 230 illustrates again the eBeam simulation contour 233, in comparison to the laser beam simulation contour 234. Sample simulations for various values of the dimensions are provided in FIGS. 15-17.

FIG. 15 shows simulated contact results for various isolated contact sizes, through pitch arrays with contact size 300×300 nm, and staggered arrays with contact size 300×300 nm. The internal SRAF dimension A is at minimum 40 nm in all but one of these simulations (38 nm for the remaining simulation), and the serif extension distance C is maximum 80 nm. Table 240 shows simulations performed on various contact sizes D, showing negative SRAF size A, serif size B, and serif extension distance C, as the dimensions are labeled in FIG. 14. Table 241 shows simulations performed on arrayed through-pitch contacts, where the contact size is 300 nm, and with various pitches P, negative SRAF size A, serif size B, and serif extension distance C. Table 242 shows simulations performed on stagger array contacts, where the contact size is 300 nm, and with various pitches P, negative SRAF size A, serif size B, and serif extension distance C. In all examples in Tables 240, 241 and 242, the resulting 2D EPE is at maximum 2.7 nm compared to the eBeam contour, as illustrated in corner magnification 243, and the 1D EPE is below 1 nm.

FIG. 16 shows similar results as FIG. 15, but with a minimum internal SRAF dimension A of 35 nm and a maximum serif extension distance C of 90 nm. Table 250 shows simulations performed on various contact sizes D, showing negative SRAF size A, serif size B, and serif extension distance C. Table 251 shows simulations performed on arrayed through-pitch contacts, where the contact size is 300 nm, and with various pitches P, negative SRAF size A, serif size B, and serif extension distance C. Table 252 shows simulations performed on stagger array contacts, where the contact size is 300 nm, and with various pitches P, negative SRAF size A, serif size B, and serif extension distance C. In all examples in Tables 250, 251 and 252, the resulting 2D EPE is approximately 1 nm, as illustrated in corner magnification 253, compared to the eBeam contour, and the 1D EPE is below 1 nm.

FIG. 17 shows similar results as FIG. 15 and FIG. 16, but with a minimum internal SRAF dimension A of 35 nm and a maximum serif extension distance C of 100 nm. Table 260 shows simulations performed on various contact sizes D, showing negative SRAF size A, serif size B, and serif extension distance C. Table 261 shows simulations performed on arrayed through-pitch contacts, where the contact size is 300 nm, and with various pitches P, negative SRAF size A, serif size B, and serif extension distance C were simulated. Table 262 shows simulations performed on stagger array contacts, where the contact size is 300 nm, and with various pitches P, negative SRAF size A, serif size B, and serif extension distance C were simulated. In all examples in Tables 260, 261 and 262, the resulting 2D EPE matches the eBeam contour, as illustrated in corner magnification 263, and the 1D EPE is below 1 nm.

Thus, FIGS. 15-17 show that by optimizing the dimensions of the negative and positive SRAF mask features, laser writing can achieve the same level of pattern accuracy as eBeam writing for rectilinear patterns of 300 nm-1000 nm.

FIGS. 18-20 demonstrate the use of SRAFs for a jog feature. FIG. 18A illustrates a designed pattern 1802 which includes a 20 nm wide by 100 nm long jog 1804. FIG. 18B illustrates a simulated exposure of pattern 1802: 1812 illustrates the simulated contour if exposed with an electron beam writer, and contour 1814 illustrates the contour if exposed with a laser writer without correction. FIG. 18C illustrates a corrected pattern 1822, which, compared to design pattern 1802, includes corrections according to an embodiment of the present method. The corrections include positive SRAFs 1824 near the ends of the jog section, and a negative SRAF 1826 in the interior of the jog section. FIG. 18D illustrates a simulation 1832 of exposure of the corrected pattern 1822. Also illustrated is a magnification 1834 of the lower part of the jog area. The maximum 2D EPE is approximately 2 nm with respect to the eBeam pattern 1812, which is greatly improved compared to the simulated contour 1814 in FIG. 18B.

Figure 19A:
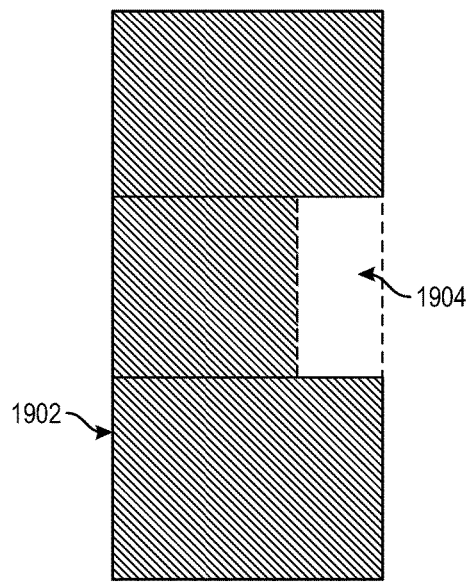
FIG. 19A-19D illustrates another example of sub-resolution assist features used in a jog feature, in accordance with some embodiments.
Figure 19B:
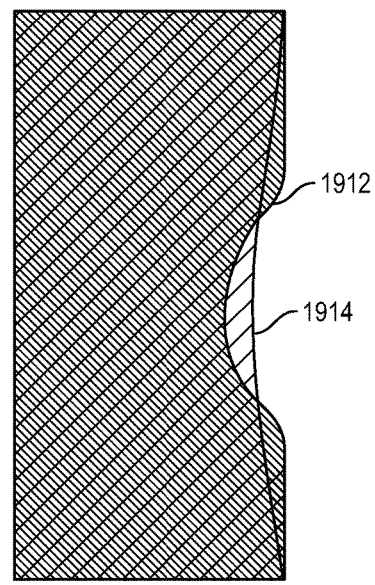
Figure 19C:
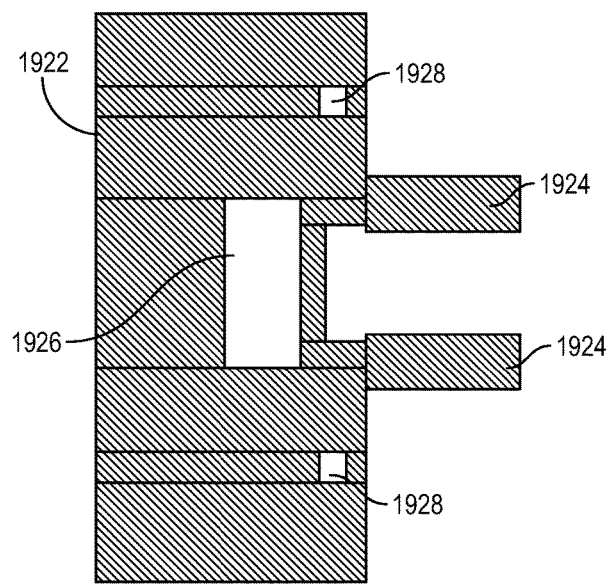
Figure 19D:
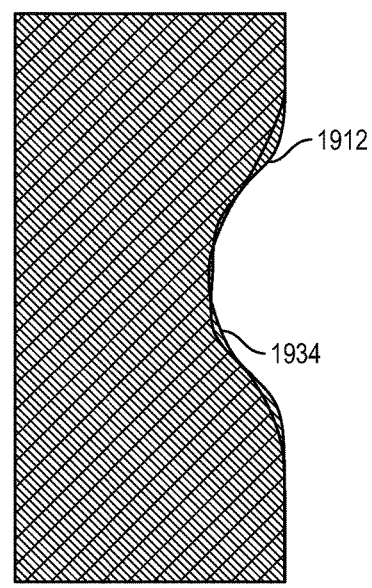

FIG. 19A illustrates a designed pattern 1902 which includes a 100 nm×40 nm jog 1904, the jog thus being deeper than the jog 1804 in FIG. 18A. FIG. 19B illustrates a simulated exposure of pattern 1902: contour 1912 for an electron beam writer, and 1914 for a laser writer. The electron beam and laser simulation parameters are the same as FIG. 18B and FIG. 18D. FIG. 19C illustrates a corrected pattern 1922 which, compared to design pattern 1902, includes corrections according to an embodiment of the present method. Pattern 1922 includes two positive SRAFs 1924 extending outwardly from the ends of the jog, one larger negative SRAF 1926 in an interior of the pattern and near the jog, and two smaller negative SRAFs 1928 internally positioned in the upper and lower regions of the pattern 1922. Compared with pattern 1822 of FIG. 18C, the positive SRAFs 1924 are longer and narrower than SRAFs 1824, the negative SRAF 1926 is smaller than SRAF 1826, and two additional negative SRAFs 1928 have been added. FIG. 19D illustrates contour 1934, which is a simulation of corrected pattern 1922 exposed with a laser writer. For comparison, contour 1912 is also shown—the simulation of the designed pattern 1902 exposed with an electron beam writer. The contour 1934 has a maximum 2D EPE of approximately 5.4 nm compared to contour 1912. As can be seen, this is much more accurate than contour 1914 of FIG. 19B.

Figure 20A:
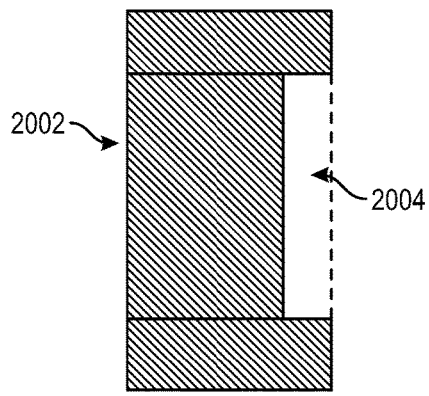
FIG. 20A-20D illustrates yet another example of sub-resolution assist features used in a jog feature, in accordance with some embodiments.
Figure 20B:
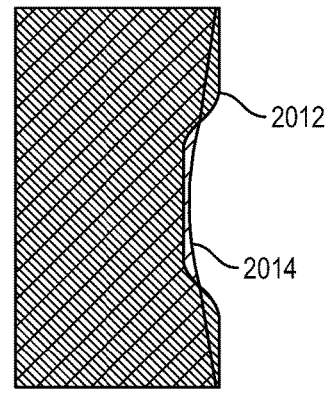
Figure 20C:
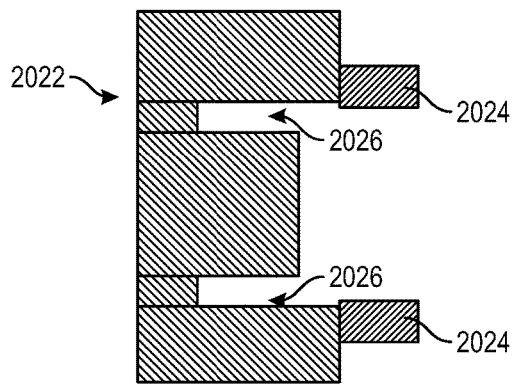
Figure 20D:
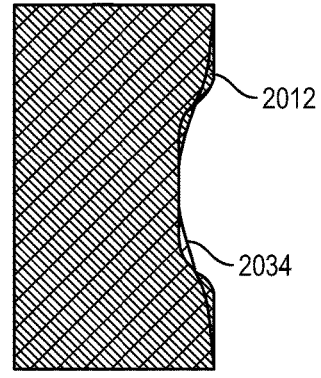

FIG. 20A illustrates a designed pattern 2002 which includes a 200 nm×40 nm jog—twice as long as jog 1904 of FIG. 19A. FIG. 20B illustrates a simulated exposure of pattern 2002: contour 2012 for an electron beam writer, and 2014 for a laser writer. The laser simulation parameters are the same as previously. FIG. 20C illustrates a corrected pattern 2022, which compared to design pattern 2002 incorporates corrections for exposure with a laser writer. Pattern 2022 includes two positive SRAFs 2024, and additionally two negative SRAFs 2026. As can be seen, SRAFs 2026 extend to the edge of the jog; that is, they are not enclosed. FIG. 20D illustrates the simulated contour 2034 of corrected pattern 2022 when exposed using a laser writer. For reference, FIG. 20D also shows contour 2012, which is the simulation of design pattern 2002 when exposed using an electron beam writer. The corrected simulation contour 2034 has a maximum 2D EPE of approximately 9.5 nm compared to contour 2012.

The above embodiments are schemes that enhance corners on laser writer, to match those of eBeam writers. Results can be achieved with less than 3 nm difference. Results can be further enhanced by considering laser writer constraints and by adding dose modulation. The modeling can support the different Gaussian radius in the X and Y directions. The present methods may apply to shapes other than the square contacts and contact arrays illustrated in this disclosure. For example, the use of positive and negative SRAFs in the same corner of a pattern may be applied to exterior or interior corners of various shapes such as rectangular patterns, L shaped patterns, lines, and the like.

Figure 21:
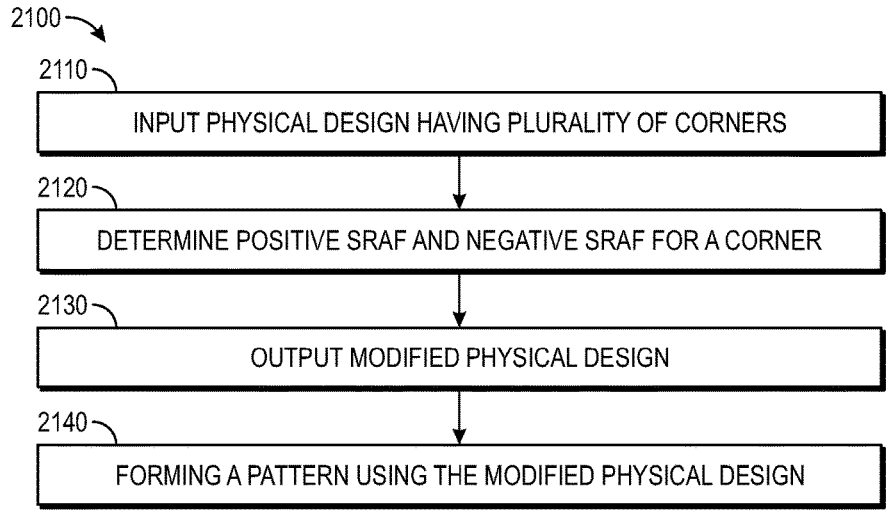
FIG. 21 is an example flow chart of applying negative and positive SRAFs to a corner according to the present embodiments.

FIG. 21 is a conceptual flow diagram 2100 of an embodiment of methods for performing optical proximity correction, using positive and negative SRAFs to improve corner rounding effects. In step 2110, a physical design is input. The physical design has a plurality of shapes, where each shape has a plurality of corners. The physical design is to be exposed on a surface of a substrate. In step 2120, a set of sub-resolution assist features (SRAFs) is determined for the physical design, where a plurality of SRAFs in the set of SRAFs interact. The plurality of SRAFs includes a positive SRAF and a negative SRAF (i.e., a hole or unexposed area), where the plurality of SRAFs together provide better dimensional control of one corner of one shape in the plurality of shapes when exposed on the substrate, compared to a using single SRAF to control the dimension of the one corner. The determining is performed using a computing hardware device. In step 2130, a modified physical design is output, the modified physical design comprising the physical design as modified by the set of SRAFs.

In some embodiments of the method of flow chart 2100 the SRAFs in the plurality of SRAFs are rectangular in shape, such as square or non-square. In some embodiments the positive SRAF is located within the negative SRAF. In some embodiments the negative SRAF is located entirely within the perimeter of one of the shapes, and additionally the negative SRAF may be located closer to the one corner (that is being modified for better dimensional control) than to other corners in the plurality of corners of the one shape. The modified physical design can be a design to be exposed using a laser writer.

Optionally, the method of flow chart 2100 may also include step 2140 to form a pattern using the modified physical design that includes the set of SRAFs that were determined in step 2120. The pattern may be formed, for example, on a resist-coated reticle, such as by using a laser writer.

The optical proximity effect corrections and simulations described in this disclosure may be implemented using general-purpose computers using Central Processing Units (CPU) with appropriate computer software as computation devices. For example, the determining of the set of sub-resolution assist features may be performed by a computing hardware processor. Due to the large amount of calculations required, multiple computers or processor cores of a CPU may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. Specialty computing hardware devices or processors may include, for example, field-programmable gate arrays (FPGA), application-specific integrated circuits (ASIC), or digital signal processor (DSP) chips. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

Figure 22:
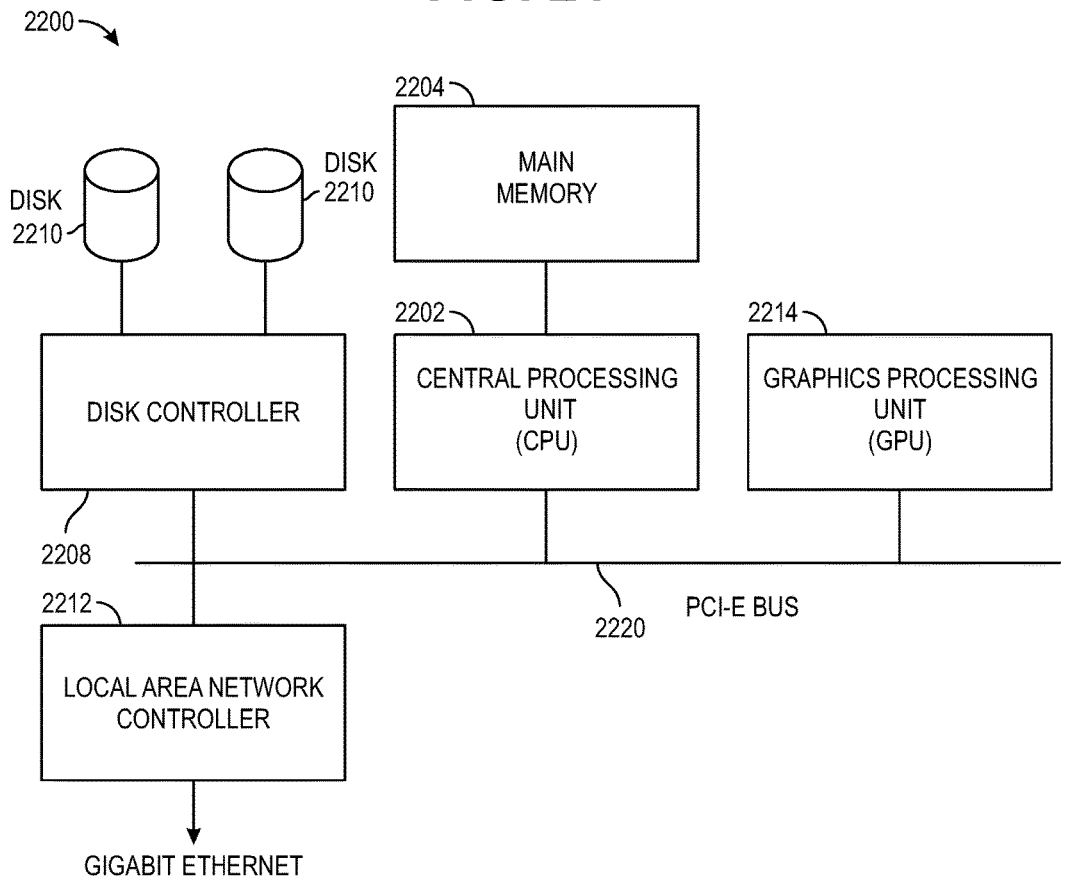
FIG. 22 illustrates an example computing hardware device used in embodiments of the methods.

FIG. 22 illustrates an example of a computing hardware device 2200 that may be used to perform the calculations described in this disclosure. Computing hardware device 2200 comprises a central processing unit (CPU) 2202, with attached main memory 2204. The CPU may comprise, for example, eight processing cores, thereby enhancing performance of any parts of the computer software that are multi-threaded. The size of main memory 2204 may be, for example, 64 G-bytes. The CPU 2202 is connected to a Peripheral Component Interconnect Express (PCIe) bus 2220. A graphics processing unit (GPU) 2214 is also connected to the PCIe bus. In computing hardware device 2200, the GPU 2214 may or may not be connected to a graphics output device such as a video monitor. If not connected to a graphics output device, GPU 2214 may be used purely as a high-speed parallel computation engine. The computing software may obtain significantly-higher performance by using the GPU for a portion of the calculations, compared to using CPU 2202 for all the calculations. The CPU 2202 communicates with the GPU 2214 via PCIe bus 2220. In other embodiments (not illustrated) GPU 2214 may be integrated with CPU 2202, rather than being connected to PCIe bus 2220. Disk controller 2208 may also be attached to the PCIe bus, with, for example, two disks 2210 connected to disk controller 2208. Finally, a local area network (LAN) controller 2212 may also be attached to the PCIe bus, and provides Gigabit Ethernet (GbE) connectivity to other computers. In some embodiments, the computer software and/or the design data are stored on disks 2210. In other embodiments, either the computer programs or the design data or both the computer programs and the design data may be accessed from other computers or file serving hardware via the GbE Ethernet.

The computing hardware device 2200 of FIG. 22 can be used as a system for optical proximity correction, where the computing hardware device 2200 is configured to add a set of sub-resolution assist features (SRAFs) to a physical design. The physical design is to be exposed on a surface of a substrate, and comprises a plurality of shapes. Each shape comprises a plurality of corners. The computing hardware device 2200 is configured to determine a plurality of SRAFs to improve dimensional control on one corner of one shape in the plurality of shapes, compared to using a single SRAF to provide dimensional control of the one corner. The plurality of SRAFs comprise a positive SRAF and a negative SRAF. In some embodiments, the physical design, including the determined SRAFs, is to be exposed using a laser writer.

In some embodiments, the negative SRAF is located closer to the one corner than to other corners in the plurality of corners of the one shape. In some embodiments, the one shape in the plurality of shapes comprises a perimeter, and the negative SRAF is located entirely within the perimeter of the one shape.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present system and method for manufacturing a surface or integrated circuit using variable shaped beam lithography may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Thus, it is intended that the present subject matter covers such modifications and variations as come within the scope of the appended claims and their equivalents.

What is claimed is:

1. A method for optical proximity correction (OPC), the method comprising:
    inputting a physical design comprising a plurality of shapes, wherein each shape comprises a plurality of corners, and wherein the physical design is to be exposed on a surface of a substrate;
    determining a set of sub-resolution assist features (SRAFs) for the physical design, wherein a plurality of SRAFs in the set of SRAFs interact with each other, wherein the plurality of SRAFs together provide better dimensional control of one corner of one shape in the plurality of shapes, when exposed on the substrate, compared to using a single SRAF to control a dimension of the one corner, wherein the plurality of SRAFs comprises a positive SRAF and a negative SRAF, and wherein the determining is performed using a computing hardware device; and
    outputting a modified physical design, wherein the modified physical design comprises the physical design, as modified by the set of SRAFs, and the modified physical design is provided for manufacturing semiconductor devices.

2. The method of claim 1 wherein the plurality of SRAFs comprises rectangular SRAFs.

3. The method of claim 1 wherein the one shape in the plurality of shapes comprises a perimeter, and wherein the negative SRAF is located entirely within the perimeter of the one shape.

4. The method of claim 3 wherein the negative SRAF is located closer to the one corner than to other corners in the plurality of corners of the one shape.

5. The method of claim 1 wherein the modified physical design is to be exposed using a laser writer.

6. A method for forming a reticle pattern on a resist-coated reticle, the method comprising:
    inputting a physical design comprising a plurality of shapes, wherein each shape comprises a plurality of corners, and wherein the physical design is to be exposed on a surface of a substrate;
    determining a set of sub-resolution assist features (SRAFs) for the physical design, wherein a plurality of SRAFs in the set of SRAFs interact with each other, wherein the plurality of SRAFs together provide better dimensional control of one corner of one shape in the plurality of shapes, when exposed on the substrate, compared to using a single SRAF to control a dimension of the one corner, wherein the plurality of SRAFs comprises a positive SRAF and a negative SRAF, and wherein the determining is performed using a computing hardware device;
    outputting a modified physical design comprising the input physical design modified by the set of SRAFs; and
    forming a reticle pattern on a resist-coated reticle with the modified physical design.

7. The method of claim 6 wherein the reticle pattern is formed on the resist-coated reticle using a laser writer.

8. The method of claim 6 wherein the negative SRAF is located closer to the one corner than to other corners in the plurality of corners of the one shape.

9. The method of claim 6 wherein the one shape in the plurality of shapes comprises a perimeter, and wherein the negative SRAF is located entirely within the perimeter of the one shape.

10. A system for optical proximity correction comprising:
    a device configured to add a set of sub-resolution assist features (SRAFs) to a physical design, the physical design being provided for manufacturing semiconductor devices, wherein:
    the physical design is to be exposed on a surface of a substrate;
    the physical design comprises a plurality of shapes;
    each shape comprises a plurality of corners; and
    the device is configured to determine a plurality of SRAFs to improve dimensional control on one corner of one shape in the plurality of shapes, compared to using a single SRAF to provide the dimensional control of the one corner, and wherein the plurality of SRAFs comprise a positive SRAF and a negative SRAF.

11. The system of claim 10 wherein the physical design, including the determined plurality of SRAFs, is to be exposed using a laser writer.

12. The system of claim 10 wherein the negative SRAF is located closer to the one corner than to other corners in the plurality of corners of the one shape.

13. The system of claim 10 wherein the one shape in the plurality of shapes comprises a perimeter, and wherein the negative SRAF is located entirely within the perimeter of the one shape.

* * * * *

UNITED STATES PATENT AND TRADEMARK OFFICE
CERTIFICATE OF CORRECTION

PATENT NO. : 10,317,790 B2  
APPLICATION NO. : 15/701366  
DATED : June 11, 2019  
INVENTOR(S) : Linyong Pang and Akira Fujimura Page 1 of 1

It is certified that error appears in the above-identified patent and that said Letters Patent is hereby corrected as shown below:

On the Title Page

Item (72) Inventors: Line 4, please delete "Leo" and please insert --Linyong-- before "Pang"

Signed and Sealed this
Twenty-seventh Day of June, 2023

Katherine Kelly Vidal
*Director of the United States Patent and Trademark Office*